(12) United States Patent
Tchoul

(10) Patent No.: US 9,203,002 B2
(45) Date of Patent: Dec. 1, 2015

(54) ULTRAVIOLET REFLECTIVE SILICONE COMPOSITIONS, REFLECTORS, AND LIGHT SOURCES INCORPORATING THE SAME

(71) Applicant: Maxim N. Tchoul, Winchester, MA (US)

(72) Inventor: Maxim N. Tchoul, Winchester, MA (US)

(73) Assignee: OSRAM SYLVANIA Inc., Wilmington, MA (US)

( * ) Notice: Subject to any disclaimer, the term of this patent is extended or adjusted under 35 U.S.C. 154(b) by 0 days.

(21) Appl. No.: 14/055,822

(22) Filed: Oct. 16, 2013

(65) Prior Publication Data

US 2014/0110733 A1  Apr. 24, 2014

Related U.S. Application Data

(60) Provisional application No. 61/716,190, filed on Oct. 19, 2012.

(51) Int. Cl.
*C08G 77/08* (2006.01)
*H01L 33/60* (2010.01)
*C08L 83/04* (2006.01)

(52) U.S. Cl.
CPC ............... *H01L 33/60* (2013.01); *C08L 83/04* (2013.01)

(58) Field of Classification Search
CPC ............................... C08L 83/04; H01L 33/60
USPC ............................................... 528/15, 31
See application file for complete search history.

(56) References Cited

U.S. PATENT DOCUMENTS

| 5,976,686 A | 11/1999 | Kaytor et al. |
| 7,160,972 B2 * | 1/2007 | Young ............... G02B 1/04 528/31 |
| 8,765,264 B2 * | 7/2014 | Kashiwagi ......... C03C 25/1095 428/429 |
| 8,809,478 B2 * | 8/2014 | Saito .................. C08L 83/04 524/588 |
| 2002/0084749 A1 | 7/2002 | Ayala et al. |
| 2009/0076186 A1 * | 3/2009 | Lassalle ............ A61L 15/585 523/111 |
| 2009/0146175 A1 * | 6/2009 | Bahadur ............ H01L 33/56 257/100 |
| 2013/0011617 A1 * | 1/2013 | Tasaki ............... B29C 45/14 428/148 |
| 2014/0091266 A1 * | 4/2014 | Takasu .............. C08L 83/04 252/582 |

* cited by examiner

*Primary Examiner* — Margaret Moore
(74) *Attorney, Agent, or Firm* — Robert F. Clark

(57) ABSTRACT

Disclosed herein are polysiloxane compositions that include a first polysiloxane and a second polysiloxane. The first and second polysiloxanes may be immiscible, and may exhibit differing refractive indices. The polysiloxane compositions may further include a curing agent and a catalyst. In some embodiments, the polysiloxane compositions significantly reflect light in at least the ultraviolet region of the electromagnetic spectrum. Reflectors and light emitting diode sources including the polysiloxane compositions are also disclosed.

34 Claims, 3 Drawing Sheets

ULTRAVIOLET REFLECTIVE SILICONE COMPOSITIONS, REFLECTORS, AND LIGHT SOURCES INCORPORATING THE SAME

CROSS REFERENCES TO RELATED APPLICATIONS

This application claims the benefit of U.S. Provisional Application No. 61/716,190, filed Oct. 19, 2012.

BACKGROUND OF THE INVENTION

LED chips can generate visible or non-visible light in a specific region of the light spectrum. The light output from the LED may be in the blue, red, green, non-visible ultraviolet (UV), near-UV light, UV light, and/or light in some other region of the spectrum, depending on the material composition of the LED. When it is desired to construct an LED light source that produces a color different from the output color of the LED, it is known to convert light output from the LED having a first wavelength or wavelength range (the "primary light" or "excitation light") to light having a second wavelength or wavelength range (the "secondary light" or "emission light") using photoluminescence.

Photoluminescence generally involves absorbing higher energy primary light with a wavelength-conversion material such as a phosphor or mixture of phosphors. Absorption of the primary light can excite the wavelength-conversion material to a higher energy state. When the wavelength-conversion material returns to a lower energy state it emits secondary light, generally of a different and longer wavelength/wavelength range than the primary light. The wavelength/wavelength range of the secondary light depends on the type of wavelength-conversion material used. Secondary light of a desired wavelength/wavelength range may therefore be attained by proper selection of wavelength-conversion material. This process may be understood as "wavelength down conversion." An LED combined with a wavelength-conversion structure that includes wavelength-conversion material such as phosphor to produce secondary light may be described as a "phosphor-converted LED" or "wavelength-converted LED."

In a known configuration an LED die is positioned in a reflector cup package and volume, and is encapsulated with a polymeric encapsulating material that is directly in contact with the emitting surface of the LED. The polymer encapsulant may contain a wavelength conversion-material designed to convert primary light emitted by the LED to another wavelength, e.g., to the visible region of the electromagnetic spectrum. In another known configuration, the wavelength-conversion material may be provided in the form of a solid, self-supporting flat structure, such as a ceramic plate, a single crystal plate or a thin film structure. Such a plate may be referred to herein as a "wavelength-conversion plate." The plate may be attached directly to the LED, e.g. by wafer bonding, sintering, gluing, etc. Such configurations, wherein a wavelength conversion material is disposed adjacent an LED chip, are referred to herein as a "chip level conversion" or "CLC" configuration. In further known configurations, a wavelength conversion material is placed remotely from the emitting surface of the LED. Such a configuration is referred to herein as a "remote conversion" configuration.

In some LED devices, a polymeric material containing fluorescent phosphor particles is used as a wavelength-conversion material to convert primary light emitted by the chip to another wavelength or wavelength range. Regardless of whether the wavelength-conversion material is used in a CLC or remote phosphor configuration, some portion of unconverted primary light emitted by the LED may be scattered by the phosphor particles and/or the polymer-air interface. To address this issue and increase the total converted light output of the device, it is known to use one or more reflective layers to reflect unconverted primary light such that it again impinges on the wavelength-conversion material.

Because titania ($TiO_2$) highly reflects visible light, titania filled polymeric compositions are often used as primary light reflectors in light emitting diode packages. However, titania tends to absorb light at shorter wavelengths, such as in the UV region of the electromagnetic spectrum. As a result, UV light impinging on a titania-based reflector may be absorbed and lost. As a result, titania-based reflectors may be unsuitable for use as a primary light reflector in a lighting system employing LEDs that emit primary light in the UV region.

Alumina ($Al_2O_3$) containing compounds, porous polymeric films, aluminum sheets and coatings have been proposed for use as reflecting elements in UV emitting LEDs. Although alumina containing compounds reflect UV light, a high mass fraction of alumina in the compound may be needed to achieve a desired level of UV reflectance, which can increase viscosity of the compound and lead to processing issues.

Aluminum sheets and coatings are electrically conductive, making them unsuitable for applications where electrical conductivity may be undesirable, such as when a reflector is applied to the surface of an electronic circuit board. As a result, aluminum reflectors are often used in the form of one or more layers that are remote from an LED and its underlying circuitry.

Similarly, the reflectivity of porous polymeric films may decrease at wavelengths shorter than the visible region, e.g., in the ultraviolet region. Moreover, porous polymeric films are generally only useful when used in sheet form, and thus may not be a suitable replacement for a reflective coating.

Accordingly, while titania-based compositions, alumina-based compositions, aluminum sheets and coatings, and porous polymeric films may be useful for some reflector applications, they may not be ideal for applications where high UV reflectance is desired, and/or where electrical conductivity is a concern.

SUMMARY OF THE INVENTION

It is an object of the invention to obviate the disadvantages of the prior art.

It is another object of the invention to provide an ultraviolet reflective silicone polymer for use with ultraviolet emitting light sources such as light emitting diodes.

It is a further object of the invention to provide an LED light source including an ultraviolet reflective silicone polymer.

In accordance with an object of the invention, there is provided a polysiloxane composition, comprising:
  a first polysiloxane;
  a second polysiloxane;
  a curing agent; and
  a catalyst;
  wherein:
  said first and second polysiloxanes are immiscible with one another and differ in refractive index; and
  said polysiloxane composition reflects greater than 50 to about 100% of light in a first wavelength range, said first wavelength range extending from about 190 nm to about 400 nm.

In another embodiment, the polysiloxane composition reflects from greater than about 70 to about 100% of light in a second wavelength range, said second wavelength range extending from about 300 to about 400 nm.

In accordance with another object of the invention, there is provided an LED light source, comprising:

at least one LED configured to emit primary light in a first wavelength range; and a reflector disposed to reflect said primary light, said reflector comprising a polysiloxane composition comprising:

a first polysiloxane;
a second polysiloxane;
a curing agent; and
a catalyst;

wherein:

said first and second polysiloxanes are immiscible with one another and differ in refractive index;

said reflector reflects greater than 50 to about 100% of light in said first wavelength range; and said first wavelength range extends from about 190 nm to about 400 nm.

BRIEF DESCRIPTION OF THE DRAWINGS

Reference is now made to the following detailed description which should be read in conjunction with the following figures, wherein like numerals represent like parts.

DETAILED DESCRIPTION OF THE INVENTION

Figure 1:
FIG. 1 illustrates an exemplary reflector consistent with the present disclosure.

As used herein, the terms "substantially" and "about" when used in connection with an amount or range mean plus or minus 5% of the stated amount or the endpoints of the stated range.

The terms "ultraviolet region" and "UV region" are interchangeably used herein to refer to the region of the electromagnetic spectrum corresponding to light having a wavelength ranging from about 10 nm to less than or equal to about 400 nm, such as about 300 to less than or equal to about 400 nm.

The term "visible region" is used herein to refer to the region of the electromagnetic spectrum corresponding to light having a wavelength ranging from greater than about 400 nm to about 750 nm.

As used herein, the terms, "light emitting diode," "LED," and "LED light source" are used interchangeably, and refer to any light emitting diode or other type of carrier injection/junction-based system that is capable of generating radiation in response to an electrical signal. Thus, the term LED includes, but is not limited to, various semiconductor-based structures that emit light in response to current, light emitting polymers, light emitting stripes, electro-luminescent strips, and the like.

In particular, the term LED refers to light emitting diodes of all types (including semi-conductor and organic light emitting diodes) that may be configured to generate light in all or various portions of one or more of the visible, ultraviolet, and UV spectrum. Non-limiting examples of suitable LEDs that may be used include various types of infrared LEDs, ultraviolet LEDs, red LEDs, green LEDs, blue LEDs, yellow LEDs, amber LEDs, orange LEDs, and white LEDs. Such LEDs may be configured to emit light over a broad spectrum (e.g., the entire visible light spectrum) or a narrow spectrum. References to the color of a phosphor, LED or conversion material refer generally to its emission color unless otherwise specified. Thus, a blue LED emits a blue light, a yellow phosphor emits a yellow light and so on.

It is known from optical physics that light or radiation may be significantly scattered and/or diffusely reflected by an article that is made from two or more non-absorbing materials of differing refractive index, provided the structure of the article provides regions of each material that are of the appropriate size. For example, to make an efficient diffuse reflector, the cross-sectional width and/or height of the regions in such a material should be about the same as the wavelength of the light and/or radiation that is to be reflected. If the cross-sectional width and/or height of the regions is/are too small, light will pass through the article without being reflected. If the cross-sectional width and/or height is/are too large, it may be necessary to significantly increase the thickness of the article in order to reflect a desirable amount of light.

With this in mind, the present disclosure describes polysiloxane compositions that scatter and/or reflect useful amounts of light in a desired region of the electromagnetic spectrum, such as the ultraviolet region. Such compositions may be useful as UV reflectors, e.g., in a light source that emits ultraviolet light. For example, the compositions described herein may be suitable for use as a reflector in an LED package, wherein the LED emits ultraviolet primary light for conversion by a wavelength conversion material. As will be described in detail below, the polysiloxane compositions of the present disclosure may reflect a substantial amount of ultraviolet light, while remaining non-conductive. As a result, the compositions described herein may provide UV reflection properties that meet or exceed those of alumina-based reflectors and/or porous polymeric film reflectors, while remaining useful in circumstances where electrical conductivity is not desired.

Accordingly, one aspect of the present disclosure relates to polysiloxane compositions. In general, the polysiloxane compositions include:

(a) a first polysiloxane (A);
(b) a second polysiloxane (B);
(c) a curing (i.e., crosslinking) agent; and
(d) a catalyst.

The first polysiloxane (A) and second polysiloxane (B) are immiscible with one another and differ in refractive index.

In some embodiments, the first polysiloxane (A) and the second polysiloxane (B) are of the general formula:

$$X_1-(SiR_1R_2O)_{n1}-X_2; \text{ and} \tag{A}$$

$$X_3-(SiR_3R_4O)_{n2}-X_4; \tag{B}$$

wherein:

$R_1$, $R_2$, $R_3$, and $R_4$ are chosen from substituted or unsubstituted linear, branched or cyclic aliphatic hydrocarbon groups, aromatic hydrocarbon groups, fluorocarbon groups and combinations thereof;

$R_1$ and $R_2$ may be the same or different;

$R_3$ and $R_4$ may be the same or different;

the combination of $R_1$ and $R_2$ differs from the combination of $R_3$ and $R_4$;

$X_1$, $X_2$, $X_3$ and $X_4$ are cross-linkable groups that may be the same or different; and n1 and n2 are the degrees of polymerization for the first polysiloxane (A) and second polysiloxane (B), respectively.

As non-limiting examples of saturated aliphatic hydrocarbon groups that may be suitable for use as $R_1$, $R_2$, $R_3$, and/or $R_4$, mention is made of substituted or unsubstituted, linear, branched, or cyclic alkyl groups of the general formula $C_xH_{(2x+1)}$, where x ranges from about 1 to about 20, such as about 1 to about 10, or even about 1 to about 3. Such groups include but are not limited to substituted or unsubstituted methyl, ethyl, propyl, isopropyl, butyl, sec-butyl, isobutyl, tert-butyl, n-pentyl, hexyl, heptyl, octyl, nonyl, decyl, pentadecyl, and icosyl groups, and the like. In some embodiments, at least one of $R_1$, $R_2$, $R_3$, and $R_4$ is a methyl group.

Non-limiting examples of unsaturated aliphatic hydrocarbon groups that may be suitable for use as $R_1$, $R_2$, $R_3$, and/or $R_4$ include substituted or unsubstituted, linear, branched, or cyclic groups of the general formula $C_yH_{2y}$, where y ranges from about 1 to about 20, such as about 1 to about 10, or even about 1 to about 3. Such groups include but are not limited to methylene and substituted or unsubstituted alkenyl groups such as propenyl, isopropenyl, butenyl, isobutenyl, and hexenyl groups, and the like.

Non-limiting examples of cyclic hydrocarbon groups that may be suitable for use as $R_1$, $R_2$, $R_3$, and/or $R_4$ include alicyclic and non-alicyclic hydrocarbon groups with about 4 to about 12 carbons in the ring, such as about 4 to about 10 carbons in the ring, or even about 4 to about 6 carbons in the ring. Such cyclic hydrocarbon groups include but are not limited to cycloalkyl groups, cycloakenyl groups, and cycloalkanedienyl groups. Suitable cycloalkyl groups include but are not limited to cyclobutyl, cyclopentyl, cyclohexyl, cycloheptyl, cyclooctyl, and cyclononyl, groups, which may be substituted or unsubstituted. Suitable cycloalkenyl groups include but are not limited to $C_4$-$C_{10}$ cycloalkenyl groups, which may be substituted or unsubstituted. Suitable cycloalkanedienyl groups include but are not limited to $C_{4-6}$ cycloalkanedienyl groups, which may be substituted or unsubstituted.

Further non-limiting examples of cyclic hydrocarbon groups that may be suitable for use as $R_1$, $R_2$, $R_3$, and/or $R_4$ include mono, bi, and/or polycyclic, substituted or unsubstituted aromatic hydrocarbons of the general formula $C_{(6+z)}H_{(5+2z)}$, where z ranges from 0 to about 10, such as 0 to about 5, or even 0 to about 3. Such groups include but are not limited to substituted or unsubstituted benzyl, phenyl, napthyl, and styrene groups. In some embodiments, at least one of $R_1$, $R_2$, $R_3$, and $R_4$ is an unsubstituted phenyl group.

Non-limiting examples of fluorocarbon groups that may be suitable for use as $R_1$, $R_3$, $R_3$, and/or $R_4$ include fluorocarbons of the general formula $C_aH_{2a}C_bF_{(2b+1)}$, where a is greater than or equal to 2 (e.g., from 2 to 4 or even 2 to 3), and b ranges from about 1 to about 20, such as about 1 to about 10, or even about 1 to about 5. Non-limiting examples of such groups include $C_2H_4CF_3$, $C_3H_6CF_3$, $C_2H_4C_2F_5$, $C_3H_6C_2F_5$, etc. In some embodiments, as least one of $R_1$, $R_2$, $R_3$, and/or $R_4$ is $C_2H_4CF_3$.

While the present disclosure envisions polysiloxane compositions wherein any of the aforementioned groups may be used as $R_1$, $R_2$, $R_3$, and $R_4$, in some embodiments $R_1$, $R_2$, $R_3$, and $R_4$ are selected such that the combination of $R_3$ and $R_4$ differs from the combination of $R_1$ and $R_2$. Thus for example, if $R_1$ and $R_2$ are both methyl, $R_3$ and $R_4$ may not also be methyl. Similarly, if $R_1$ is methyl and $R_2$ is phenyl, the combination of $R_3$ and $R_4$ may not also be methyl and phenyl. Therefore in some embodiments, $R_1$, $R_2$, and $R_3$ may be methyl, and $R_4$ may be a group other than methyl, such as $C_2H_4CF_3$ or phenyl. In other embodiments, $R_1$ may be methyl, $R_2$ may be phenyl or $C_2H_4CF_3$, $R_3$ may be methyl, and $R_4$ may be phenyl or $C_2H_4CF_3$, so long as $R_2$ does not equal $R_4$. In still further embodiments, $R_1$ and $R_2$ are both methyl, and $R_3$ and $R_4$ are both phenyl. In additional embodiments, $R_1$ and $R_2$ are methyl and $C_2H_4CF_3$, respectively, and $R_3$ and $R_4$ are both phenyl. Of course, such combinations are exemplary only, and the present disclosure envisions all embodiments wherein the combination of $R_1$ and $R_2$ is not the same as the combination of $R_3$ and $R_4$.

$X_1$, $X_2$, $X_3$, and $X_4$ may be the same or different, and may be any crosslinkable group. Non-limiting examples of such groups include alkoxy, epoxy, hydrogen, hydroxyl, and vinyl groups, another group capable of reacting with the curing agent, and combinations thereof. In some embodiments, at least one of $X_1$, $X_2$, $X_3$, and $X_4$ is a vinyl group. In further non-limiting embodiments, each of $X_1$, $X_2$, $X_3$, and $X_4$ is a vinyl group.

As noted above, n1 and n2 are the respective degrees of polymerization of the first and second polysiloxanes. Without limitation, n1 and n2 may be the same or different, and may range from about 10 to about 1000, such as about 10 to about 500, or even about 10 to about 100.

The first and second polysiloxanes may be present in the polysiloxane compositions described herein in any amount, so long as both are present. In some embodiments, the amount of the first and second polysiloxanes is selected such that the first polysiloxane (A) and second polysiloxane (B) are individually or collectively present in an amount ranging from about 50 to about 99% by weight, such as about 70 to about 99% by weight, or even about 90 to about 99% by weight of the total weight of the polysiloxane composition. In some embodiments, the first polysiloxane (A) is present in an amount ranging from about 10 to about 50 weight % (e.g., about 30 weight %), the second polysiloxane is present in an amount ranging from about 50 to about 90 weight %, and the total amount of first and second polysiloxane ranges from about 90 to about 99 weight %, relative to the total weight of the polysiloxane composition.

Alternatively or additionally, the amount of first and/or second polysiloxane may be controlled such that the ratio of first polysiloxane (A) to second polysiloxane (B) ranges from about 1:9 to about 1:1, such as about 1:5 to about 1:1, or even about 1:3 to about 1:1. In some embodiments, polysiloxane (A) and polysiloxane (B) are present in a ratio ranging from 1:9 to 1:1, and the total amount of polysiloxane (A) and polysiloxane (B) ranges from about 90 to about 99% of the total weight of the polysiloxane composition.

The curing agent may be any component that is capable of reacting with at least one of $X_1$, $X_2$, $X_3$, and $X_4$. In some embodiments, the curing agent is a copolymeric component of the general formula:

$$Z_1\text{---}(SiR_5R_6O)_{c1}\text{---}(SiR_7YO)_{c2}\text{---}Z_2 \qquad (C)$$

wherein:

$R_5$, $R_6$ and $R_7$ may be the same or different, and are chosen from saturated or unsaturated aliphatic hydrocarbon groups, cyclic hydrocarbon groups, aromatic hydrocarbon groups, and fluorocarbon groups;

$Z_1$ and $Z_2$ are end (i.e., terminal) groups, and may be the same or different;

Y is a group capable of crosslinking with at least one of $X_1$, $X_2$, $X_3$ and $X_4$; and c1 and c2 represent the number of monomer units in the corresponding blocks.

As non-limiting examples of saturated or unsaturated aliphatic hydrocarbon groups, cyclic hydrocarbon groups, aromatic hydrocarbon groups, and fluorocarbon groups that may be used as $R_5$, $R_6$, and/or $R_7$, mention is made of the linear, branched or cyclic, substituted or unsubstituted, saturated or unsaturated aliphatic groups, aromatic hydrocarbon groups, and fluorocarbon groups specified above as suitable for use as $R_1$, $R_2$, $R_3$, and/or $R_4$. In some embodiments, at least one of $R_5$, $R_6$, and $R_7$ is methyl. In further non-limiting embodiments, all of $R_5$, $R_6$, and $R_7$ are methyl.

As noted previously, $Z_1$ and $Z_2$ may be any suitable end group. As examples of suitable end groups that may be used as $Z_1$ and $Z_2$, mention is made of the groups specified above for $R_1$, $R_2$, $R_3$, $R_4$, and Y. In some embodiments, $Z_1$ and $Z_2$ are methyl. In additional embodiments, $Z_1$ and $Z_2$ are the same as group Y in formula (C). Of course, such groups are exemplary only, and other end groups may also be used as $Z_1$ and/or $Z_2$.

Y may be any group that is capable of crosslinking with at least one of $X_1$, $X_2$, $X_3$ and $X_4$. Non-limiting examples of such groups include hydrogen, vinyl, alkoxy, acetoxy, hydroxyl, amine groups, combinations thereof, and the like. In some embodiments, Y is hydrogen if one or more of $X_1$-$X_4$ is vinyl, Y is vinyl if one or more of $X_1$-$X_4$ is hydrogen, Y is alkoxy or acetoxy if one or more of $X_1$-$X_4$ is hydroxyl, Y is hydroxyl if one or more of $X_1$-$X_4$ is alkoxy, and Y is an amine containing group if one or more of $X_1$-$X_4$ is epoxy.

c1 and c2 in formula (C) represent the number of monomer units in the corresponding blocks of the copolymeric curing agent, and may be any suitable value. In some embodiments, one or both of c1 and c2 range from about 1 to about 100, such as about 1 to about 50, or even about 1 to about 25.

As non-limiting examples of curing agents consistent with the present disclosure, mention is made of trimethylsiloxy terminated poly(methylhydrogensiloxane) and hydride terminated poly(methylhydrogensiloxane)-co-(phenylmethylsiloxane). Such copolymers may be used alone or in combination. In some embodiments, a blend of trimethylsiloxy terminated poly(methylhydrogensiloxane) and hydride terminated poly(methylhydrogensiloxane)-co-(phenylmethylsiloxane) with a ratio of above 1:5 to about 1:1 is used as a curing agent.

The amount of curing agent used in the polysiloxane compositions of the present disclosure may vary widely. In some embodiments, the curing agent is present in an amount ranging from about 1 to about 20% by weight, such as about 1 to about 15% by weight, about 1 to about 10% by weight, or even about 3 to about 10% by weight, relative to the total weight of the polysiloxane composition.

Any suitable catalyst may be used in the polysiloxane compositions of the present disclosure. In some embodiments, the catalyst may be chosen from catalysts that are capable of instigating or otherwise promoting the catalytic polymerization of the first polysiloxane (A), second polysiloxane (B), and the curing agent to result in a polysiloxane composition consistent with the present disclosure. Non-limiting examples of such catalysts include platinum, palladium, tin, and titanium based catalysts. As non-limiting examples of suitable catalysts that may be used, mention is made of platinum complexes in divinyltetramethyldisiloxane, chloroplatinic acid, other platinum complexes of a chelate structure, combinations thereof, and the like. Any suitable amount of catalyst may be used. For example, the amount of catalyst may range from about 10 to about 1000 parts per million (ppm), such as about 10 to about 500 ppm, or even about 10 to about 100 ppm.

The first polysiloxane (A) and second polysiloxane (B) exhibit differing refractive indices when measured at the same wavelength, e.g., at a wavelength in the ultraviolet range. Without wishing to be bound by theory, it is believed that the difference in refractive index may be due in part to the difference in the combination of $R_1$ and $R_2$ in polysiloxane (A), and the combination of $R_3$ and $R_4$ in polysiloxane (B). It may therefore be understood that the first polysiloxane (A) may have a first refractive index, $n_1$, and the second polysiloxane (B) may have a second refractive index, $n_2$, wherein $n_1$ does not equal $n_2$.

In some embodiments, polysiloxane (A) and polysiloxane (B) exhibit respective first ($n_1$) and second ($n_2$) refractive indices ranging from about 1.3 to about 1.7, such as about 1.38 to about 1.56, wherein $n_1$ and $n_2$ differ by greater than or equal to about 0.02, such as greater than or equal to about 0.05, 0.07, 0.1, 0.15, or even 0.18. Put in other terms, polysiloxane (A) may exhibit a first refractive index ($n_1$) that is greater or less than the second refractive index ($n_2$) of polysiloxane (B) by about 0.2 to about 0.18. In some instances, the reflectivity of the polysiloxane compositions described herein increases as the difference between $n_1$ and $n_2$ increases, and vice versa.

As noted previously, first polysiloxane (A) and second polysiloxane (B) are immiscible with one another. Accordingly, first polysiloxane (A) and second polysiloxane (B) may be understood as having limited solubility in one another or as being completely insoluble in one another. Because the first and second polysiloxanes are immiscible, the polysiloxane compositions described herein may exhibit a microstructure upon curing wherein regions of first polysiloxane (A) are distributed within one or more regions of second polysiloxane (B), or vice versa. For example, the polysiloxane compositions may take the form of a colloid, emulsion, and/or dispersion wherein droplets of first polysiloxane (A) are distributed within with second polysiloxane (B), or vice versa. In some embodiments, the polysiloxane compositions are in the form of an emulsion, wherein regions (e.g., droplets) of first polysiloxane (A) are distributed within regions of second polysiloxane (B).

In some embodiments, the regions of polysiloxane (A) and/or regions of polysiloxane (B) are substantially the same size as one or more wavelengths of ultraviolet light. That is, the regions (e.g., droplets) of polysiloxane (A) and/or regions of polysiloxane (B) may have a cross-sectional height and/or width in the range of about 10 nm to about 400 nm, such as about 50 to about 400 nm, or even 190 to about 400 nm.

Without wishing to be bound by theory, it is believed that the combination of the difference in the refractive indices of polysiloxane (A) and polysiloxane (B) and the microstructure of the polysiloxane compositions allows the compositions to reflect useful quantities of ultraviolet light. Indeed in some embodiments, the polysiloxane compositions may reflect greater than or equal to about 75%, greater than or equal to about 85%, greater than or equal to about 95%, greater than or equal to about 99%, or even 100% of incident ultraviolet light.

In some embodiments of the present disclosure, one or both of the first and second polysiloxanes are copolymers of the formula (D) and (E), respectively:

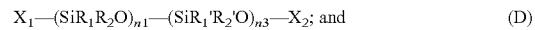

$X_1$—(SiR$_1$R$_2$O)$_{n1}$—(SiR$_1$'R$_2$'O)$_{n3}$—X$_2$; and  (D)

$X_3$—(SiR$_3$R$_4$O)$_{n2}$—(SiR$_3$'R$_4$'O)$_{n4}$—X$_4$;  (E)

wherein:

$n_1$ and $n_2$ are as specified above for formulae (A) and (B) above, respectively;

$n_3$ and $n_4$ may the same or different, and may range from about 10 to about 1000, such as about 10 to about 500, or even about 10 to about 100;

$R_1$, $R_2$, $R_3$, $R_4$ are as specified above for formulae (A) and (B) above, respectively $R_1$' and $R_2$' may be the same or different, and are selected from the groups specified above for $R_1$ and $R_2$;

$R_3'$ and $R_4'$ may be the same or different, and are selected from the groups specified above for $R_3$ and $R_4$; and one or both of the following conditions is true:
at least one of $R_1'$ and $R_2'$ differs from $R_1$ and $R_2$; and
at least one of $R_3'$ and $R_4'$ differs from $R_3$ and $R_4$.

As non-limiting examples of polysiloxane (A) and (B) of formulae (D) and (E) above, mention is made of vinyl terminated poly(dimethylsiloxane)-co-(trifluoropropylmethylsiloxane) copolymer and vinyl terminated poly(dimethylsiloxane)-co-(diphenylsiloxane) copolymer, respectively. In some embodiments, the polysiloxane compositions described herein include such copolymers in a ratio (A:B) of about 1:5 to about 1:1. Although such a composition may be cured using any suitable curing agent, in some embodiments the composition is cured using a mixture of trimethylsiloxy terminated poly(methylhydrogensiloxane) and hydride terminated poly(methylhydrogensiloxane)-co-(phenylmethylsiloxane) in a ratio from 1:5 to 1:1. The amount of this curing agent may vary within the amounts specified above, and in some embodiments ranges from about 3 to about 10% by weight, relative to the total weight of the polysiloxane composition.

In addition to the aforementioned components, the polysiloxane compositions of the present disclose may also contain conventional fillers and/or additive materials. Non-limiting examples of such fillers and additives include anti-static agents, antioxidant dyes, pigments, and plasticizers, materials that absorb light in a specified region of the electromagnetic spectrum (e.g., all or a portion of the ultraviolet, visible, infrared, etc. regions), nucleating agents, and the like. Such materials may be added in any quantity, but are preferably added in amounts that do not detract from the formation of the polysiloxane compositions described herein and/or their reflective properties. Accordingly, one or more fillers and/or additives may be added to the polysiloxane compositions described herein in an amount less than or equal to about 10 weight %, such as less than or equal to about 7.5 weight %, less than or equal to about 5 weight %, less than or equal to about 2.5 weight %, less than or equal to about 1%, or even less than or equal to about 0.5 weight %, relative to the total weight of the polysiloxane composition.

Another aspect of the present disclosure relates to reflectors that include or are formed by at least one polysiloxane composition consistent with the present disclosure. In this regard, reference is made to FIG. 1, which depicts one example of a reflector consistent with the present disclosure. As shown, reflector 100 includes a substrate 101 and reflecting layer 102. Reflecting layer 102 may be formed by depositing a polysiloxane composition consistent with the present disclosure on substrate 101.

Substrate 101 may be formed of any material that is capable of supporting reflecting layer 102. For example, substrate 101 may be formed form a metallic, non-metallic, alloy, composite, or other material. Non-limiting examples of such materials include silica ($SiO_2$), quartz, titania, aluminum, polymeric materials, and the like. In some embodiments, substrate 101 can reflect light in a desired region of the electromagnetic spectrum, e.g., in a wavelength range other than the wavelength range(s) that is (are) reflected by reflector layer 102. For example, if reflector layer 102 reflects light in the ultraviolet region but not the visible region, substrate 101 may be configured to reflect light in the visible region. In such instances, reflector 100 may be configured to reflect ultraviolet and visible light that is incident thereon.

Although reflecting layer 102 is shown in FIG. 1 as a continuous coating on substrate 101, such configuration is exemplary only. Indeed, reflecting layer 102 may be deposited on substrate 101 to form a patterned coating, a discontinuous coating, etc. on substrate 101. Alternatively or additionally, reflector 100 may be formed by reflecting layer 102 alone, i.e., without the use of substrate 101. In such instances, reflector 100 may be formed by casting or otherwise forming reflecting layer 102 independently, i.e., without substrate 101. Alternatively or additionally, reflector 100 may be formed by casting reflecting layer 102 on substrate 101, and removing reflecting layer 102 from substrate 101, e.g., via peeling or another process.

In any case, reflecting layer 102 may have any suitable thickness. For example, the thickness of reflecting layer 102 may range from greater than 0 to about 10 mm, such as greater than 0 to about 5 mm, greater than 0 to about 3 mm, greater than 0 to about 2 mm, or even greater than 0 to about 1 mm. In some embodiments, reflecting layer 102 has a thickness of about 2 mm.

Another aspect of the present disclosure relates to light sources that include a reflective article consistent with the present disclosure. Although the present disclosure contemplates the use of the reflecting articles described herein, such articles may be particularly suitable for use as primary light reflectors in an LED light source. In this regard, reference is made to FIGS. 2A and 2B, which depict exemplary LED sources in cross section that include one or more reflectors consistent with the present disclosure.

Figure 2A:
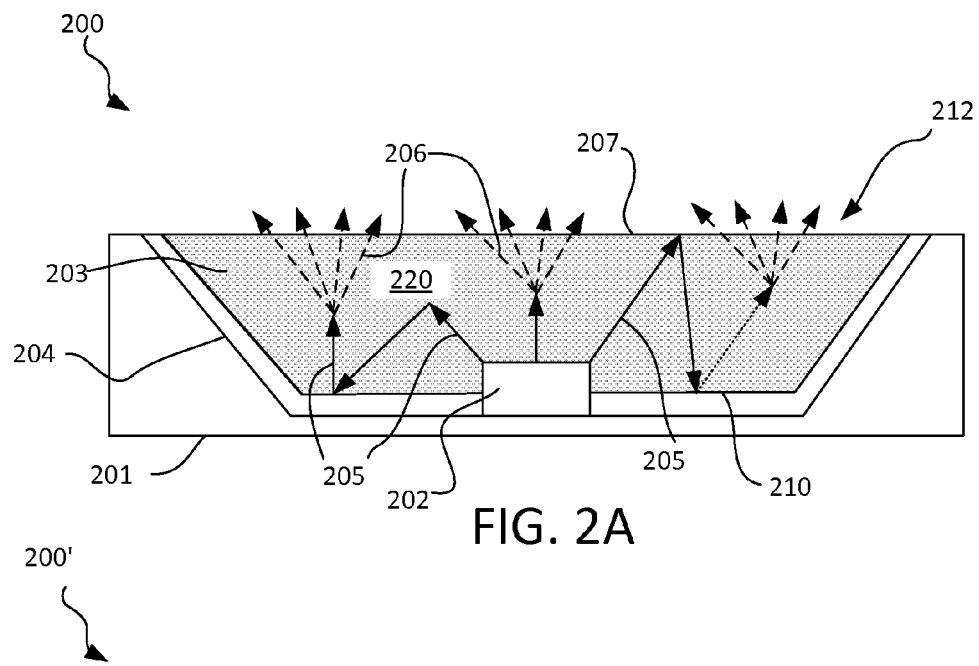
FIGS. 2A and 2B illustrate in cross section exemplary LED light sources including a reflector consistent with the present disclosure.

As shown in FIG. 2A, LED light source 200 includes LED frame 201, LED 202, encapsulating material 203, and reflector 204. LED frame 201 includes a cavity 220 in which LED 202 is disposed. Reflector 204 is disposed about LED 202, and encapsulating material 203 and LED frame 201.

LED frame 201 may be any frame that is suitable for supporting LED 202, reflector 204, and encapsulating material 203. In some embodiments, LED frame 201 may be circuit board containing electrical circuits, contacts, etc. for driving LED 202. In such instances, it may be understood that LED frame 201 includes components that may be sensitive to contact with other electrically conductive components. Alternatively or additionally, LED frame 201 may be a support structure that provides mechanical support for other components in LED light source 200.

LED 202 may be any LED that is capable of emitting primary light from a light emitting surface thereof. Although LEDs that emit primary light in the ultraviolet region are preferred, LEDs that emit primary light in other regions of the spectrum may also be used.

Regardless of its nature, LED 202 may emit primary light 205 from an emitting surface thereof (not labeled). Primary light 205 may be emitted from LED 202 in any direction, but preferably towards the aperture 212 of LED light source 200. Subsequent to emission by LED 202, primary light 205 may impinge on encapsulating material 203. As may be appreciated, encapsulating material 203 may be formed from or include one or more wavelength-conversion materials that are capable of converting primary light 205 to secondary light. For example, encapsulating material 203 may be a polymeric material that contains one or more phosphors (e.g., in particulate form) for converting primary light 205 to secondary light 206. Alternatively or additionally, encapsulating material may be in the form of a wavelength converting plate, which may be disposed proximate to or remote from the light emitting surface of LED 202, i.e., in a chip layer conversion or remote phosphor conversion configuration.

Regardless of the nature of encapsulating material 203 and the wavelength converting material contained therein, some portion of primary light 205 emitted from LED 202 may be back scattered, i.e., reflected or scattered towards the base 210 of the cavity 220 defined by LED frame 201. For example, some of primary light 205 may impinge on wavelength-converting material in encapsulating material 203 and be scattered back towards LED 202, instead of being converted to secondary light 206. Alternatively or additionally, a portion of primary light 205 may pass through encapsulating material 203 without being converted to secondary light. While such primary light may escape LED light source 200, some portion of it may be backscattered towards LED 202 when it impinges on interface 207. In instances where encapsulating material 203 includes a polymer material, interface 207 may be understood to be a "polymer-air interface." These concepts are illustrated in FIG. 2A by the redirection of arrows of primary light 205 from interface 207 and within encapsulating material 203 back towards LED 202.

With this in mind, reflector 204 may be a reflector consistent with the present disclosure. That is, reflector 204 may include first and second polysiloxanes that are immiscible with one another and which differ in refractive index. In general, Reflector 204 is configured such that it reflects a significant quantity of primary light 205. For example reflector 204 may be configured to greater than or equal to about 75%, 85%, 95%, or even 99% of primary light 205 that is incident thereon. In some embodiments, LED 202 emits primary light 205 in the ultraviolet region of the electromagnetic spectrum, encapsulating material 203 includes or is formed from a wavelength converting material capable of converting primary light 205 to another wavelength, and reflector 204 is configured to reflect greater than about 90%, such as greater than about 95%, greater than about 99%, or even 100% of primary light 205.

Due to its reflective properties, reflector 204 may reflect backscattered primary light 205 such that it again impinges on encapsulating material 203 and the wavelength converting material(s) therein. As a result, reflector 204 may increase the opportunity for backscattered primary light 205 to be converted to secondary light 206, thus improving the conversion efficiency and light output of LED light source 200.

Figure 2B:
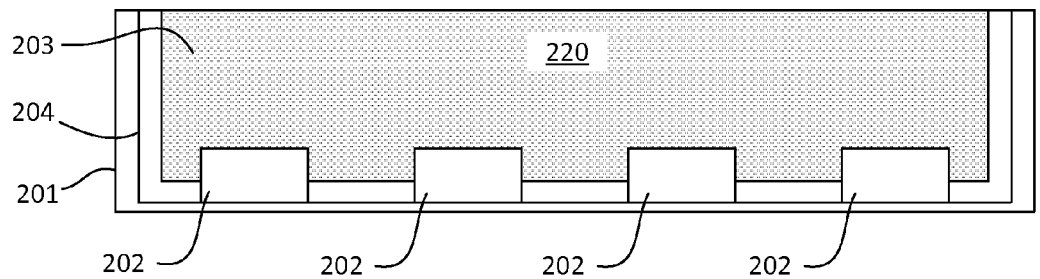

FIG. 2B. illustrates another exemplary LED light source including a reflector consistent with the present disclosure. As shown, LED light source 200' includes LED frame 201, LEDs 202, encapsulating material 203, and reflector 204. Apart from the use of multiple LEDs 202 and the distribution of reflector 204 between such LEDs, the nature and function of the components of LED light source 200' is the same as the similarly numbered components in FIG. 2A. The operation and configuration of such components is therefore not reiterated.

EXAMPLES

To explore their usefulness and ultraviolet reflective properties, various polysiloxane compositions consistent with the present disclosure were produced as described below in examples 1 through 3. The total reflectance of these exemplary compositions in the ultraviolet ranges was compared to the total reflectance of titania- and alumina-based reflectors, which were produced as described below in comparative examples 4 and 5.

Examples 1-3

10, 30, And 50 Weight % of Poly(Phenylmethyl Siloxane) in Poly(Dimethylsiloxane)

Samples of three different polysiloxane compositions were produced by mixing vinyl terminated poly(phenylmethylsiloxane) (PPMS) with a molecular weight of 2000 g/mol ($n_D$=1.537) with vinyl terminated poly(dimethylsiloxane) (PDMS) with a molecular weight of 28000 g/mol ($n_D$=1.404). The total amount of PPMS and PDMS in each sample (i.e., in examples 1-3) was about 95%. The ratio of PPMS to PDMS was 1:9 in example 1, 1:2.3 in example 2, and 1:1 in example 3. Thus, relative to the total amount of PPMs and PDMS, example 1 contained 10 weight % of PPMS and 90 weight % of PDMS, example 2 contained 30 weight % of PPMS and 70 weight % of PDMS, and example 3 contained 50 weight % of PPMS and 50 weight % of PDMS. An amount of 5% by weight of poly(dimethylsiloxane)-co-(methylhydrogen siloxane) copolymer having a molecular weight of 2000 g/mol and a 25% molar fraction of Si—H groups was added to each sample as a curing agent. The resulting mixture was stirred for 5 minutes, resulting in the formation of a white liquid appearing on inspection to be in the form of an emulsion. A platinum complex (0.03 mg of platinum in divinyltetramethylsiloxane) was then added as a catalyst. The resulting compositions were each deposited to a thickness of 2 mm on a glass slide, and allowed to cure at 70° C. for one hour.

Comparative Examples 4 and 5

As reference comparative examples, titania-based and alumina-based reflectors were prepared. The reference reflectors were prepared by mixing 10% of titania (anatase) and 10% of alumina, respectively, in polydimethylsiloxane. An amount of 5% by weight of poly(dimethylsiloxane)-co-(methylhydrogen siloxane) copolymer having a molecular weight of 2000 g/mol and a 25% molar fraction of Si—H groups was added to each sample as a curing agent. A platinum complex (0.03 mg of platinum in divinyltetramethylsiloxane) was then added as a catalyst. The resulting compositions were each deposited to a thickness of 2 mm on a glass slide, and allowed to cure at 70° C. for one hour.

Figure 3:
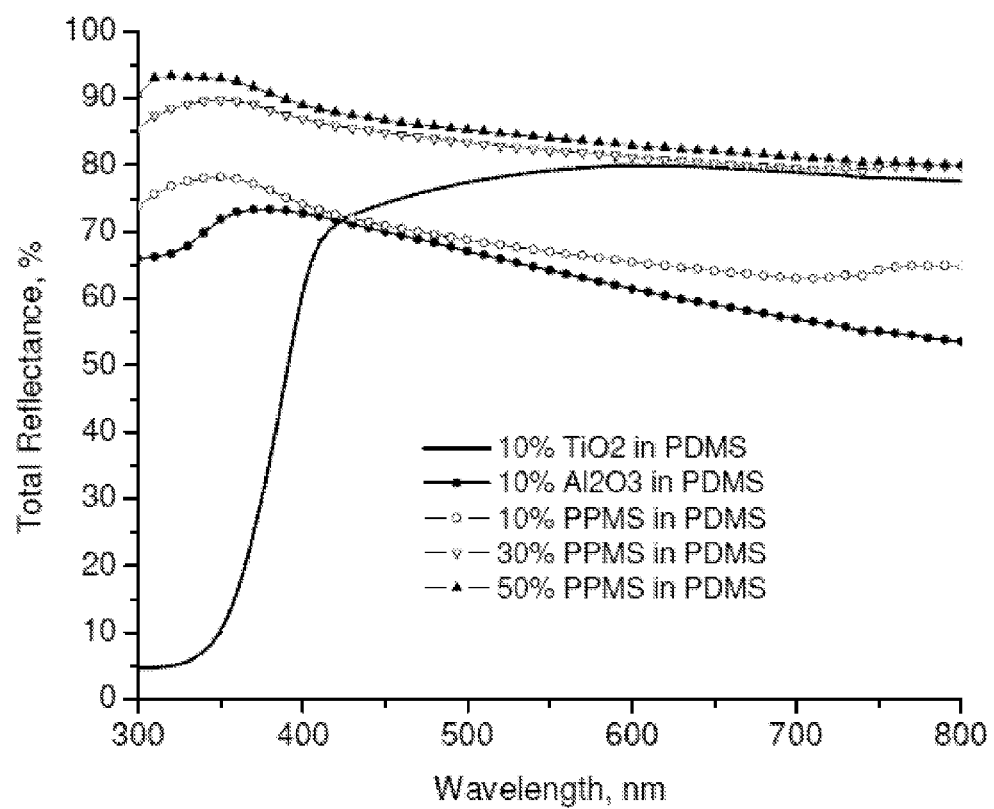
FIG. 3 is a plot of total reflectance vs. wavelength of several exemplary reflector compositions consistent with the present disclosure against prior art titania reflector and alumina reflectors.

The total reflectance spectra of examples 1-3 and comparative examples 4-5 were measured using a Lambda-900 spectra from PERKIN ELMER™ over a wavelength range of 300 nm to 800 nm. The results are shown in FIG. 3. As shown, the titania-based reflector reflected >80% of light above 400 nm, but began to lose its reflectivity below 400 nm. In contrast, the reflectors formed from Examples 1-3 exhibited their highest reflectivity in the region of 300-400 nm. While the reflector formed from example 1 (10% PPMS) exhibited lower visible light reflectivity than the titania-based reflector, the reflectors formed from examples 2 and 3 exhibited higher visible light reflectance in that range. The reflectors formed from the inventive samples also met or exceeded the reflectivity of the alumina-based reflector in both the ultraviolet and visible ranges.

Other than in the examples, or where otherwise indicated, all numbers expressing endpoints of ranges, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. Any numerical value inherently contains certain errors necessarily resulting from the standard deviation found in their respective testing measurements. At the very least, each numerical parameter should be construed in light of the number of significant digits and ordinary rounding approaches.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A polysiloxane composition, comprising:
   a first polysiloxane;
   a second polysiloxane;
   a curing agent; and
   a catalyst;
wherein:
   said first and second polysiloxanes are immiscible with one another and differ in refractive index; and
   said polysiloxane composition reflects greater than 50 to about 100% of light in a first wavelength range, said first wavelength range extending from about 190 nm to about 400 nm.

2. The polysiloxane composition of claim 1, wherein said first polysiloxane is of the formula (A) below and said second polysiloxane is of formula (B) below:

$$X_1-(SiR_1R_2O)_{n1}-X_2; \quad (A)$$

$$X_3-(SiR_3R_4O)_{n2}-X_4; \quad (B)$$

wherein:
   $R_1$, $R_2$, $R_3$, and $R_4$ are chosen from substituted or unsubstituted, linear, branched or cyclic aliphatic hydrocarbon groups, aromatic hydrocarbon groups, fluorocarbon groups, and combinations thereof;
   $R_1$ and $R_2$ may be the same or different;
   $R_3$ and $R_4$ may be the same or different;
   the combination of $R_1$ and $R_2$ differs from the combination of $R_3$ and $R_4$;
   $X_1$, $X_2$, $X_3$ and $X_4$ are cross-linkable groups that may be the same or different; and
   n1 and n2 are the degrees of polymerization for the first polysiloxane (A) and second polysiloxane (B), respectively, and range from about 1 to about 100.

3. The polysiloxane composition of claim 2, wherein at least one of $R_1$, $R_2$, $R_3$, and $R_4$ is chosen from:
   substituted or unsubstituted, linear, branched or cyclic alkyl group of the formula $C_xH_{(2x+1)}$, where x ranges from about 1 to about 20;
   substituted or unsubstituted, linear, branched or cyclic unsaturated aliphatic groups of the formula $C_yH_{2y}$, where y ranges from about 1 to about 20;
   cyclic or alicyclic hydrocarbon groups comprising at least one ring containing about 4 to about 12 carbon atoms;
   mono, bi, or polycyclic hydrocarbons of the formula $C_{(6+z)}H_{(5+2z)}$, where z ranges from 0 to about 10;
   fluorocarbon groups of the formula $C_aH_{2a}C_bF_{(2b+1)}$, where a ranges from about 2 to about 4, and b ranges from about 1 to about 20.

4. The polysiloxane compositions of claim 3, wherein at least one of $R_1$, $R_2$, $R_3$, and $R_4$ is a functional group selected from the group consisting of:
   substituted or unsubstituted methyl, ethyl, propyl, isopropyl, butyl, sec-butyl, isobutyl, tert-butyl, n-pentyl, hexyl, heptyl, octyl, nonyl, decyl, pentadecyl, and icosyl groups;
   substituted or unsubstituted methylene, propenyl, isopropenyl, butenyl, isobutenyl, and hexenyl groups;
   substituted or unsubstituted benzyl, phenyl, napthyl, and styrene groups;
   $C_2H_4CF_3$, $C_3H_6CF_3$, $C_2H_4C_2F_5$, $C_3H_6C_2F_5$; and combinations thereof.

5. The polysiloxane composition of claim 4, wherein $R_1$, $R_2$, $R_3$, and $R_4$ are functional groups selected from the group consisting of: methyl, phenyl, and $C_2H_4CF_3$.

6. The polysiloxane composition of claim 4, wherein $R_1$, $R_2$, and $R_3$ are methyl, and $R_4$ is a functional group selected from the group consisting of phenyl and $C_2H_4CF_3$.

7. The polysiloxane composition of claim 2, wherein:
   $X_1$, $X_2$, $X_3$, and $X_4$ are crosslinkable groups selected from the group consisting of alkoxy, epoxy, hydroxy, hydroxyl, and vinyl groups; and
   at least one of $X_1$, $X_2$, $X_3$, and $X_4$ reacts with said curing agent.

8. The polysiloxane composition of claim 2, wherein said curing agent is a copolymer of the formula (C) below:

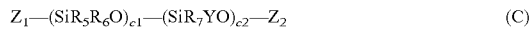
$$Z_1-(SiR_5R_6O)_{c1}-(SiR_7YO)_{c2}-Z_2 \quad (C)$$

wherein:
   $R_5$, $R_6$ and $R_7$ may be the same or different, and are chosen from saturated or unsaturated aliphatic hydrocarbon groups, cyclic hydrocarbon groups, aromatic hydrocarbon groups, and fluorocarbon groups;
   $Z_1$ and $Z_2$ are terminal groups and may be the same or different;
   Y is a group capable of crosslinking with at least one of $X_1$, $X_2$, $X_3$ and $X_4$; and
   c1 and c2 represent the number of monomer units in respective copolymer blocks of said curing agent and range from about 1 to about 100.

9. The polysiloxane composition of claim 8, wherein $R_5$, $R_6$, and $R_7$ are functional groups selected from:
   substituted or unsubstituted, linear, branched or cyclic alkyl group of the formula $C_xH_{(2x+1)}$, where x ranges from about 1 to about 20;
   substituted or unsubstituted, linear, branched or cyclic unsaturated aliphatic groups of the formula $C_yH_{2y}$, where y ranges from about 1 to about 20;
   cyclic or alicyclic hydrocarbon groups comprising at least one ring containing about 4 to about 12 carbon atoms;
   mono, bi, or polycyclic hydrocarbons of the formula $C_{(6+z)}H_{(5+2z)}$, where z ranges from 0 to about 10;
   fluorocarbon groups of the formula $C_aH_{2a}C_bF_{(2b+1)}$, where a ranges from about 2 to about 4, and b ranges from about 1 to about 20.

10. The polysiloxane composition of claim 9, wherein at least one of $R_5$, $R_6$, and $R_7$ is methyl.

11. The polysiloxane composition of claim 9, wherein each of $R_5$, $R_6$, and $R_7$ is methyl.

12. The polysiloxane composition of claim 8, wherein Y is a functional group selected from the group consisting of hydrogen, vinyl, alkoxy, acetoxy, hydroxyl, amine groups, and combinations thereof.

13. The polysiloxane composition of claim 12, wherein:
   Y is hydrogen if one or more of $X_1$-$X_4$ is a vinyl group;
   Y is vinyl if one or more of $X_1$-$X_4$ is an hydrogen group;
   Y is alkoxy or acetoxy if one or more of $X_1$-$X_4$ is an hydroxyl group;
   Y is hydroxyl if one or more of $X_1$-$X_4$ is an alkoxy group; and
   Y is an amine containing group if one or more of $X_1$-$X_4$ is an epoxy group.

14. The polysiloxane composition of claim 2, wherein said catalyst comprises platinum, palladium, tin, titanium, or a combination thereof.

15. The polysiloxane composition of claim 1, wherein:
the total amount of said first polysiloxane and said second polysiloxane ranges from about 50 to about 99% by weight, relative to the total weight of the polysiloxane composition; and
said first polysiloxane and said second polysiloxane are present in a ratio ranging from about 1:9 to about 1:1.

16. The polysiloxane composition of claim 1, wherein said curing agent is present in an amount ranging from about 1 to about 20% by weight, relative to the total weight of the polysiloxane composition.

17. The polysiloxane composition of claim 2, wherein said polysiloxane composition reflects from greater than about 70 to about 100% of light in a second wavelength range, said second wavelength range extending from about 300 to about 400 nm.

18. An LED light source, comprising:
at least one LED configured to emit primary light in a first wavelength range; and
a reflector disposed to reflect said primary light,
said reflector comprising a polysiloxane composition comprising:
a first polysiloxane;
a second polysiloxane;
a curing agent; and
a catalyst;
wherein:
said first and second polysiloxanes are immiscible with one another and differ in refractive index;
said reflector reflects greater than 50 to about 100% of light in said first wavelength range; and
said first wavelength range extends from about 190 nm to about 400 nm.

19. The LED light source of claim 18, wherein said light source includes at least one wavelength conversion material capable of converting primary light to secondary light having a different wavelength.

20. The LED light source of claim 18, wherein said reflector further comprises a substrate, wherein said polysiloxane composition is deposited on said substrate.

21. The LED light source of claim 18, wherein said first polysiloxane is of the formula (A) below and said second polysiloxane is of formula (B) below:

$$X_1-(SiR_1R_2O)_{n1}-X_2; \quad (A)$$

$$X_3-(SiR_3R_4O)_{n2}-X_4; \quad (B)$$

wherein:
$R_1$, $R_2$, $R_3$, and $R_4$ are chosen from substituted or unsubstituted, linear, branched or cyclic aliphatic hydrocarbon groups, aromatic hydrocarbon groups, fluorocarbon groups, and combinations thereof;
$R_1$ and $R_2$ may be the same or different;
$R_3$ and $R_4$ may be the same or different;
the combination of $R_1$ and $R_2$ differs from the combination of $R_3$ and $R_4$;
$X_1$, $X_2$, $X_3$ and $X_4$ are cross-linkable groups that may be the same or different; and
$n1$ and $n2$ are the degrees of polymerization for the first polysiloxane (A) and second polysiloxane (B), respectively, and range from about 1 to about 100.

22. The LED light source of claim 21, wherein at least one of $R_1$, $R_2$, $R_3$, and $R_4$ is chosen from:
substituted or unsubstituted, linear, branched or cyclic alkyl group of the formula $C_xH_{(2x+1)}$, where X ranges from about 1 to about 20;
substituted or unsubstituted, linear, branched or cyclic unsaturated aliphatic groups of the formula $C_yH_{2y}$, where y ranges from about 1 to about 20;
cyclic or alicyclic hydrocarbon groups comprising at least one ring containing about 4 to about 12 carbon atoms;
mono, bi, or polycyclic hydrocarbons of the formula $C_{(6+z)}H_{(5+2z)}$, where z ranges from 0 to about 10;
fluorocarbon groups of the formula $C_aH_{2a}C_bF_{(2b+1)}$, where a ranges from about 2 to about 4, and b ranges from about 1 to about 20.

23. The LED light source of claim 22, wherein at least one of $R_1$, $R_2$, $R_3$, and $R_4$ is a functional group selected from the group consisting of:
substituted or unsubstituted methyl, ethyl, propyl, isopropyl, butyl, sec-butyl, isobutyl, tert-butyl, n-pentyl, hexyl, heptyl, octyl, nonyl, decyl, pentadecyl, and icosyl groups;
substituted or unsubstituted methylene, propenyl, isoprepenyl, butenyl, isobutenyl, and hexenyl groups;
substituted or unsubstituted benzyl, phenyl, napthyl, and styrene groups;
$C_2H_4CF_3$, $C_3H_6CF_3$, $C_2H_4C_2F_5$, $C_3H_6C_2F_5$;
and combinations thereof.

24. The LED light source of claim 23, wherein $R_1$, $R_2$, $R_3$, and $R_4$ are functional groups selected from the group consisting of: methyl, phenyl, and $C_2H_4CF_3$.

25. The LED light source of claim 24, wherein $R_1$, $R_2$, and $R_3$ are methyl, and $R_4$ is a functional group selected from the group consisting of phenyl and $C_2H_4CF_3$.

26. The LED light source of claim 21, wherein:
$X_1$, $X_2$, $X_3$, and $X_4$ are crosslinkable groups selected from the group consisting of alkoxy, epoxy, hydroxy, hydroxyl, and vinyl groups; and
at least one of $X_1$, $X_2$, $X_3$, and $X_4$ reacts with said curing agent.

27. The LED light source of claim 21, wherein said curing agent is a copolymer of the formula (C) below:

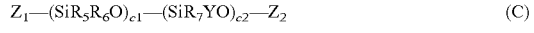

$$Z_1-(SiR_5R_6O)_{c1}-(SiR_7YO)_{c2}-Z_2 \quad (C)$$

wherein:
$R_5$, $R_6$ and $R_7$ may be the same or different, and are chosen from saturated or unsaturated aliphatic hydrocarbon groups, cyclic hydrocarbon groups, aromatic hydrocarbon groups, and fluorocarbon groups;
$Z_1$ and $Z_2$ are terminal groups and may be the same or different;
Y is a group capable of crosslinking with at least one of $X_1$, $X_2$, $X_3$ and $X_4$; and
c1 and c2 represent the number of monomer units in respective copolymer blocks of said curing agent and range from about 1 to about 100.

28. The LED light source of claim 27, wherein $R_5$, $R_6$, and $R_7$ are functional groups selected from:
substituted or unsubstituted, linear, branched or cyclic alkyl group of the formula $C_xH_{(2x+1)}$, where X ranges from about 1 to about 20;
substituted or unsubstituted, linear, branched or cyclic unsaturated aliphatic groups of the formula $C_yH_{2y}$, where y ranges from about 1 to about 20;
cyclic or alicyclic hydrocarbon groups comprising at least one ring containing about 4 to about 12 carbon atoms;
mono, bi, or polycyclic hydrocarbons of the formula $C_{(6+z)}H_{(5+2z)}$, where z ranges from 0 to about 10;
fluorocarbon groups of the formula $C_aH_{2a}C_bF_{(2b+1)}$, where a ranges from about 2 to about 4, and b ranges from about 1 to about 20.

29. The LED light source of claim 28, wherein each of $R_5$, $R_6$, and $R_7$ is methyl.

30. The LED light source of claim 27, wherein Y is a functional group selected from the group consisting of hydrogen, vinyl, alkoxy, acetoxy, hydroxyl, amine groups, and combinations thereof.

31. The LED light source of claim 30, wherein:
Y is hydrogen if one or more of $X_1$-$X_4$ is a vinyl group;
Y is vinyl if one or more of $X_1$-$X_4$ is an hydrogen group;
Y is alkoxy or acetoxy if one or more of $X_1$-$X_4$ is an hydroxyl group;
Y is hydroxyl if one or more of $X_1$-$X_4$ is an alkoxy group; and
Y is an amine containing group if one or more of $X_1$-$X_4$ is an epoxy group.

32. The LED light source of claim 18, wherein:
the total amount of said first polysiloxane and said second polysiloxane ranges from about 50 to about 99% by weight, relative to the total weight of the polysiloxane composition; and
said first polysiloxane and said second polysiloxane are present in a ratio ranging from about 1:9 to about 1:1.

33. The LED light source of claim 18, wherein said curing agent is present in an amount ranging from about 1 to about 20% by weight, relative to the total weight of the polysiloxane composition.

34. The LED light source of claim 18, wherein said reflector reflects from greater than about 70 to about 100% of light in a third wavelength range, said third wavelength range extending from about 300 to about 400 nm.

* * * * *